US009099515B2

(12) United States Patent
Chang et al.

(10) Patent No.: US 9,099,515 B2
(45) Date of Patent: Aug. 4, 2015

(54) RECONFIGURABLE GUIDE PIN DESIGN FOR CENTERING WAFERS HAVING DIFFERENT SIZES

(71) Applicant: Taiwan Semiconductor Manufacturing Company, Ltd., Hsin-Chu (TW)

(72) Inventors: Hsin Chang, Hsin-Chu (TW); Hsin-Yu Chen, Taipei (TW); Fang Wen Tsai, Hsin-Chu (TW); Jing-Cheng Lin, Hsin-Chu (TW); Wen-Chih Chiou, Miaoli (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/973,740

(22) Filed: Aug. 22, 2013

(65) Prior Publication Data

US 2013/0334832 A1 Dec. 19, 2013

Related U.S. Application Data

(62) Division of application No. 12/954,180, filed on Nov. 24, 2010, now Pat. No. 8,567,837.

(51) Int. Cl.
*B66F 19/00* (2006.01)
*H01L 21/687* (2006.01)
*B65G 47/90* (2006.01)

(52) U.S. Cl.
CPC ............ *H01L 21/6875* (2013.01); *B65G 47/90* (2013.01); *H01L 21/68707* (2013.01); *Y10T 74/20305* (2015.01)

(58) Field of Classification Search
CPC .. B65G 47/90; B25J 15/0253; B25J 11/0095; B25J 15/026; H01L 21/677; H01L 21/68707; H01L 21/68771; H01L 21/6875; Y10S 414/141
USPC .......................... 294/119.1, 213, 902; 414/941
See application file for complete search history.

(56) References Cited

U.S. PATENT DOCUMENTS

| 4,256,429 | A | * | 3/1981 | Dwyer .......................... 414/626 |
|---|---|---|---|---|
| 5,171,031 | A | | 12/1992 | Nishiyama |
| 5,391,917 | A | | 2/1995 | Gilmour et al. |
| 5,510,298 | A | | 4/1996 | Redwine |
| 5,700,046 | A | | 12/1997 | Van Doren et al. |
| 5,767,001 | A | | 6/1998 | Bertagnolli et al. |
| 5,998,292 | A | | 12/1999 | Black et al. |
| 6,109,677 | A | | 8/2000 | Anthony |
| 6,184,060 | B1 | | 2/2001 | Siniaguine |

(Continued)

FOREIGN PATENT DOCUMENTS

| CN | 1979792 A | 6/2007 | |
|---|---|---|---|
| JP | 2003077975 A | 3/2003 | |
| WO | WO 2010016505 A1 * | 2/2010 | ............. B65G 49/06 |

*Primary Examiner* — Saul Rodriguez
*Assistant Examiner* — Gabriela Puig
(74) *Attorney, Agent, or Firm* — Slater & Matsil, L.L.P.

(57) ABSTRACT

An apparatus includes a robot arm, and a plurality of guide pins mounted on the robot arm. Each of the plurality of guide pins includes a plurality of wafer supports at different levels, with each of the plurality of wafer supports configured to support and center a wafer having a size different from wafers configured to be supported and centered by remaining ones of the plurality of wafer supports.

19 Claims, 6 Drawing Sheets

(56) References Cited

U.S. PATENT DOCUMENTS

| | | |
|---|---|---|
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,048,316 B1 | 5/2006 | Blank et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,234,913 B2 * | 6/2007 | Heiland et al. ............... 414/806 |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,987,019 B2 | 7/2011 | Morikawa |
| 8,585,112 B2 * | 11/2013 | Kawakami et al. ......... 294/119.1 |
| 2004/0113444 A1 | 6/2004 | Blonigan et al. |
| 2006/0125260 A1 | 6/2006 | Chae et al. |
| 2007/0128008 A1 | 6/2007 | Morikawa |
| 2009/0110532 A1 | 4/2009 | Salek |
| 2010/0290886 A1 * | 11/2010 | Hashimoto et al. ........... 414/800 |
| 2011/0142578 A1 * | 6/2011 | Kawakami et al. ...... 414/222.01 |
| 2011/0215602 A1 | 9/2011 | Shirasaki |
| 2013/0020820 A1 * | 1/2013 | Bieler ...................... 294/119.1 |

* cited by examiner

US 9,099,515 B2

RECONFIGURABLE GUIDE PIN DESIGN FOR CENTERING WAFERS HAVING DIFFERENT SIZES

This is a divisional application of U.S. application Ser. No. 12/954,180, which was filed on Nov. 24, 2010 and is incorporated herein by reference.

BACKGROUND

In integrated circuit manufacturing processes, semiconductor wafers typically need to be processed on spin modules, for example, when photo resists are coated on the semiconductor wafers and developed. During these process steps, the semiconductor wafers need to be centered accurately on the chucks that are used to support and secure the semiconductor wafers.

Semiconductor wafers can be placed on chucks first, and then centered. Alternatively, the placement and the centering can be performed simultaneously by placing wafers on movable arms, which have guide pin sets for defining the accurate positions of the semiconductor wafers. The positions of guide pin sets are accurately adjusted to allow the semiconductor wafers to be placed on them, with a very small allowance, so that the wafers will not shift when limited by the guide pin sets.

The required accuracy in the positions of guide pin sets, however, causes a reduction in the throughput of manufacturing processes when wafers having different sizes are processed on the same spin module. For example, semiconductor wafer and the corresponding carrier wafers have different sizes, and may need to be processed by the same spin module. For the same spin module to handle wafers with different sizes, the positions of the guide pins need to be adjusted back and forth to suit different sizes. The throughput is thus adversely affected.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel robot arm with guide pins mounted thereon for guiding and centering wafers is provided in accordance with an embodiment. The variations and the operation of the embodiment are discussed. Throughout the various views and illustrative embodiments, like reference numbers are used to designate like elements.

Figure 1A:
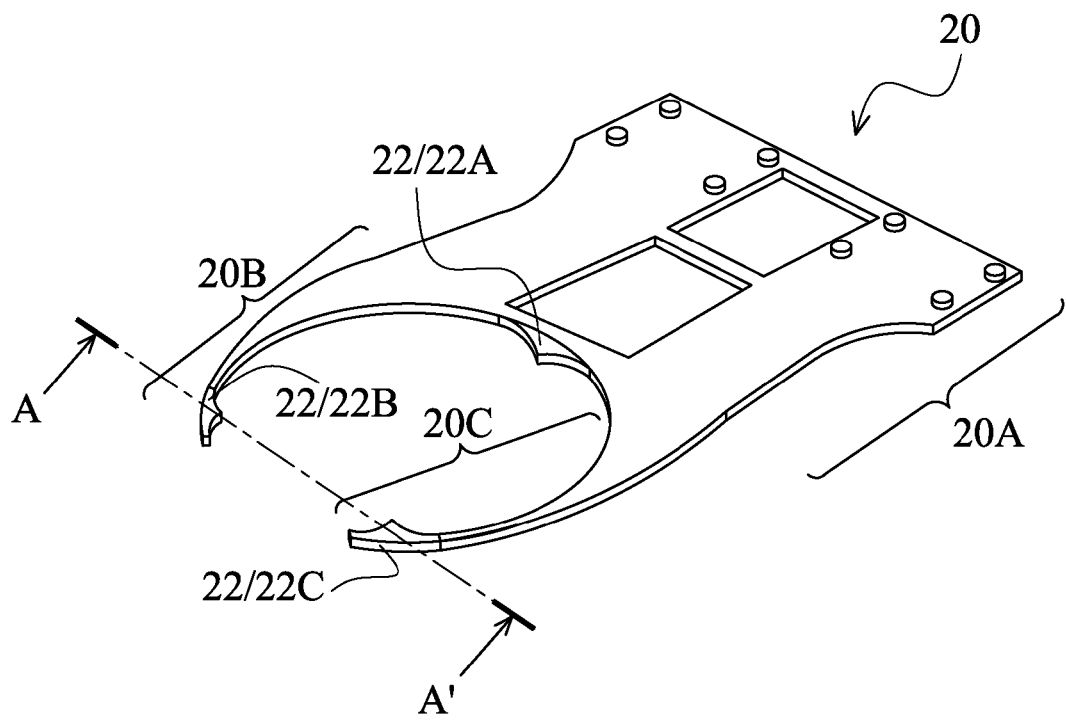
FIG. 1A illustrates a perspective view of a robot arm comprising guide pins mounted thereon.

FIG. 1A illustrates a perspective view of robot arm 20, which may be a part of a robot (not shown) for supporting, guiding, centering, and transferring semiconductor wafers. Robot arm 20 may be a part of process robot arm (PRA), which is configured to make a three-dimensional movement for the transportation of semiconductor wafers. A set of guide pins 22 (including guide pins 22A, 22B, and 22C, for example) are mounted on robot arm 20. Guide pins 22 may include three or more guide pins, which are disposed to form a circle (refer to circle 23 in FIG. 2). In an embodiment as shown in FIG. 1A, guide pins 22B and 22C may be mounted on arc arms 20B and 20C of robot arm 20, while guide pin 22A is mounted on base 20A of robot arm 20.

Figure 1B:
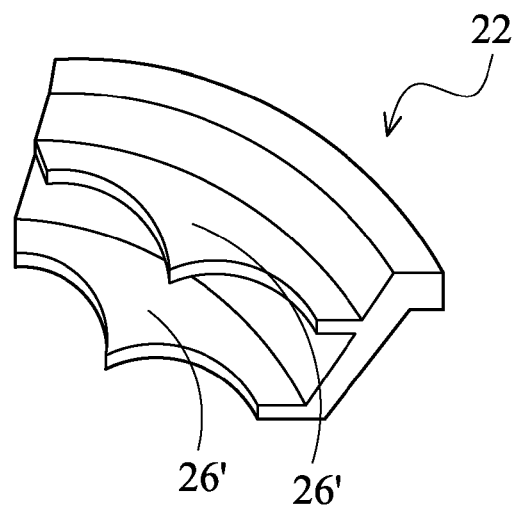
FIG. 1B illustrates a magnified perspective view of an exemplary guide pin.
Figure 2:
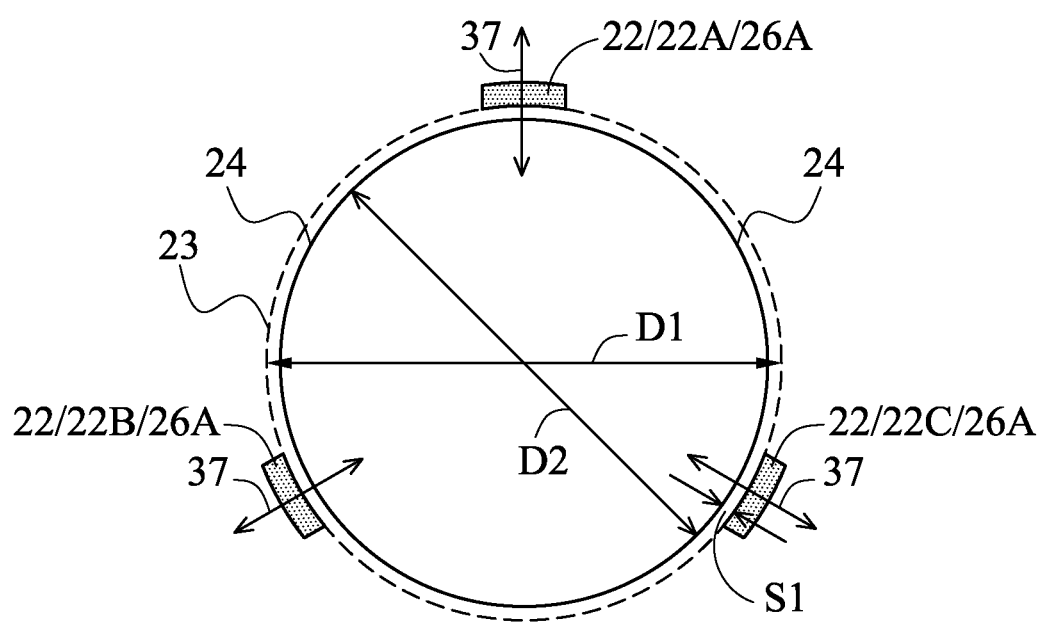
FIG. 2 illustrates a top view of a wafer centered by guide pins.

FIG. 1B illustrates an exemplary magnified view of one of guide pins 22. FIG. 2 illustrates a top view of guide pins 22, and wafer 24 that is supported and centered by guide pins 22. In the illustrated embodiments, three guide pins 22 form circle 23 and have substantially equal distances from each other, although they may also be arranged at different positions of circle 23.

Figure 3A:
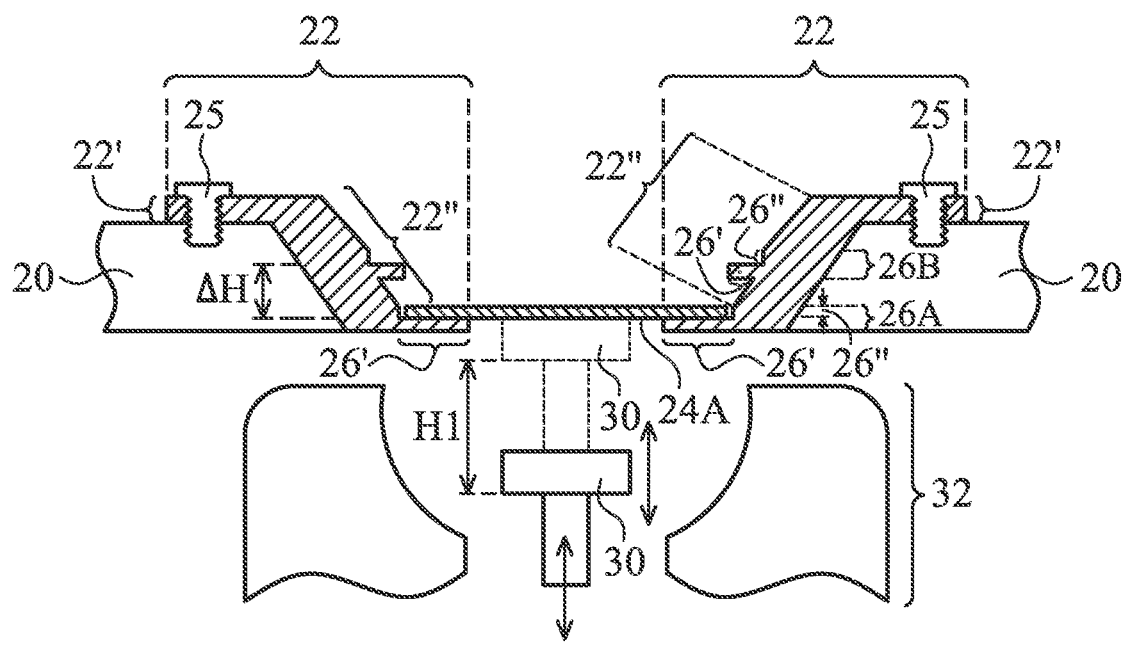
FIGS. 3A and 3B illustrate cross-sectional views of guide pins, and wafers placed on different wafer supports of the guide pins.

FIG. 3A illustrates the cross-sectional view obtained from the plane crossing line A-A' in FIG. 1A, wherein robot arm 20 and guide pins 22 are illustrated. Wafer 24A that is supported and centered by guide pins 22 is also illustrated. Guide pins 22 have more than one level of wafer supports 26 (denoted as 26A and 26B), with each level of wafer supports being at a different level than other levels. Each level of wafer supports 26A and 26B is configured to have one wafer (such as 24A in FIG. 3A and 24B in FIG. 3B) dispatched thereon. Furthermore, each level of wafer supports 26A and 26B includes a bottom horizontal portion 26' for supporting wafer 24A, and side edge portions 26" for limiting wafer 24A from shifting in directions (horizontal directions in the illustrated example) perpendicular to the major surfaces of wafer 24A. Throughout the description, when guide pins (and a level of wafer support) are referred to as being configured to support and center a wafer, it indicates that the wafer can be placed on the guide pins (and the level of wafer support), with a minimum allowance S1 (FIG. 2) left on a side(s) of the wafer, so that the wafer can be placed on the respective wafer support, and will not shift in directions perpendicular to the major surfaces of the respective wafer. Referring to FIG. 2, in an exemplary embodiment, wafer 24A has diameter D2 equal to about 300 mm, while guide pin supports 26A form circle 23 that has diameter D1 equal to about 300.3 mm, with allowance S1 being about 0.3 mm, for example.

Referring back to FIG. 3A, in an exemplary embodiment, height difference ΔH between neighboring horizontal portion 26' is equal to about 10 mm, although different height differences may be used. The thickness of horizontal portions 26' may be between 1 mm and about 2 mm, and may be 1 mm in an example. Guide pins 22 may be secured on robot arm 20 through screws 25. The portions 22', which may be top portion of guide pins 22 and are penetrated by screws 25, may have a thickness between about 1 mm and about 2 mm.

In alternative embodiments, more than two, such as three, four, and even more levels of wafer supports 26 may be formed. Different levels of wafer supports 26 may be attached onto slanted portion 22" that is not perpendicular to portions 26' of wafer supports 26. Accordingly, from the bottom to the top of each guide pin 22, different wafer supports 26 are configured to support and center wafers with increasingly greater diameters.

Referring again to FIG. 3A, wafer 24A is transferred by robot arm 20 and placed on vacuum chuck 30, which supports and secures wafer 24A. After the transferring of wafer 24A, wafer 24A is placed on wafer support 26A (the lower level) of guide pins 22. Referring to FIG. 2, since diameter D1 of circle 23 that is formed by wafer supports 26A is equal to the diameter of wafer 24A plus the minimum allowance S1, wafer 24A is also centered and is not allowed to shift. Accordingly, when wafer 24A is placed on vacuum chuck 30, the centering of wafer 24A on vacuum chuck 30 is also achieved. Vacuum chuck 30 may be a portion of a coater 32 (for coating photo resists), a developer (for developing photo resists, also illustrated as 32), or the like. For vacuum chuck 30 to receive wafer 24A, vacuum chuck 30 may rise from its original position (as illustrated using solid lines) to a position (as illustrated using dashed lines) directly under and contacting wafer 24A, with the rising height being illustrated as height H1. Vacuum chuck 30 then retracts back to its original position after wafer 24A is received.

Figure 3B:
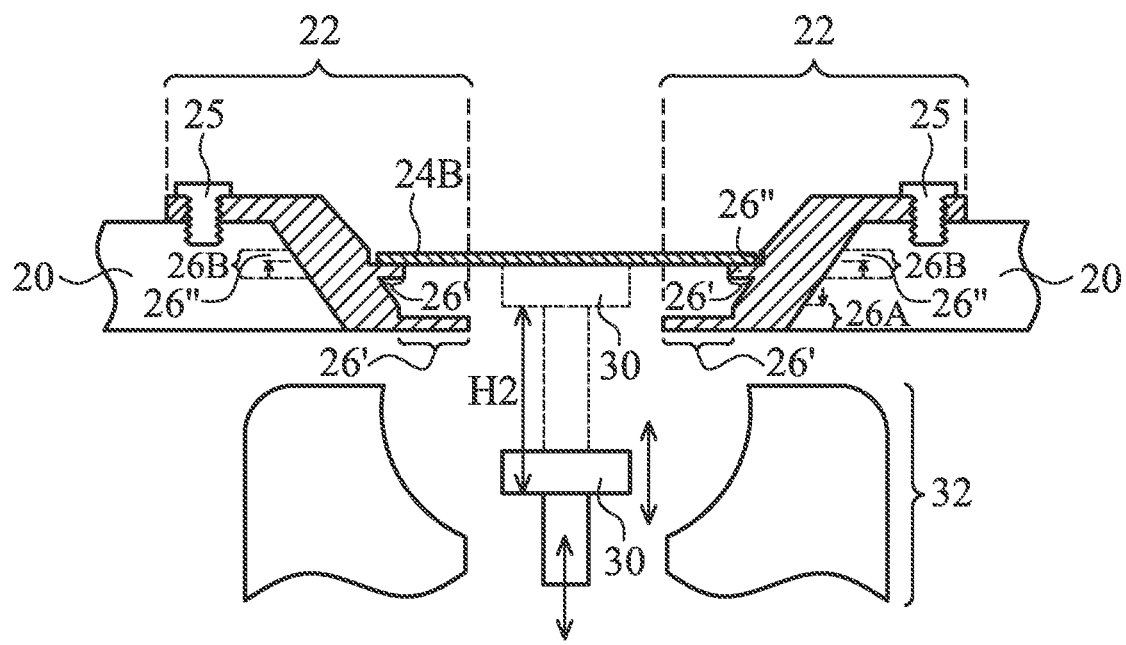

FIG. 3B illustrates that wafer 24B, which have a different diameter than wafer 24A, is transferred by robot arm 20 and placed on vacuum chuck 30. In an exemplary embodiment, wafer 24A is a semiconductor wafer, and wafer 24B is a carrier wafer (such as a glass wafer) for being attached on and supporting the respective semiconductor wafer. The diameter of wafer 24B is greater than the diameter of wafer 24A. Accordingly, wafer 24B is received and supported by wafer supports 26B of guide pins 22, with wafer supports 26B being at levels higher than that of wafer supports 26A. Further, the circle 23 (FIG. 2) defined by wafer supports 26B is larger than the circle defined by wafer supports 26A. Wafer 24B is supported by the horizontal portions 26' of wafer supports 26B. Since the diameter of the circle formed by wafer supports 26B is equal to the diameter of wafer 24B plus the minimum allowance, when wafer 24B is placed on vacuum chuck 30, the centering of wafer 24B on vacuum chuck 30 is also achieved. In an embodiment, wafer 24B has a diameter equal to about 301 mm, while wafer supports 26B form a circle having a diameter equal to about 301.3 mm, with the minimum allowance being about 0.3 nm, for example. For vacuum chuck 30 to receive wafer 24B, vacuum chuck 30 may rise from its original position (as illustrated using solid lines) to a position (as illustrated using dashed lines) directly under and contacting wafer 24B, with the rising height being illustrated as height H2. Vacuum chuck 30 then retracts back to its original position after wafer 24B is received.

Figure 4:
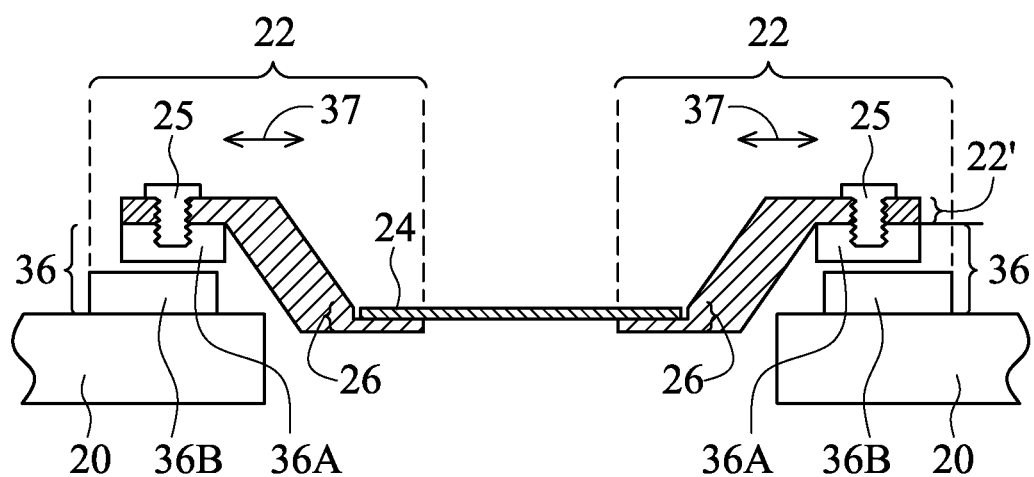
FIG. 4 illustrates a cross-sectional view of micro stage controlled guide pins, which are mounted on movable parts of micro stages.

FIG. 4 illustrates an alternative embodiment, in which robot arm 20 includes micro stage controlled guide pins 22. Each of guide pins 22 may include wafer support 26 and micro stage 36, with wafer support 26 being secured on the movable part 36A of micro stage 36. Micro stage 36 further comprises a fixed part 36B fixed on robot arm 20. Accordingly, when movable part 36A is controlled to move relative to the fixed part 36B, the respective wafer support 26 also moves along with movable part 36A. Micro stages 36 may include closed-loop linear motors and encoders (not shown), so that upper part 36A can be controlled to travel a predetermined distance in precision. In an embodiment, all of guide pins 22 (referring to FIG. 1A) include micro stages 36.

In alternative embodiments, guide pins 22B and 22C, which are on arc arms 20B and 20C, respectively, include micro stages 36, while guide pin 22A is mounted on base 20A of robot arm 20 directly, without a micro stage therebetween.

Each of micro stages 36 includes an electrical motor (not shown) that is drivable by an electrical signal, which causes movable part 36A to move. As shown by arrows 37 in FIGS. 2 and 4, when the movable parts 36A of micro stages 36 move outwardly, the diameter of the circle defined by guide pins 22 increases. Conversely, when the movable parts 36A of micro stages 36 move inwardly, the diameter of the circle defined by guide pins 22 decreases. Accordingly, the micro stage controlled guide pins 22 are configured to support and center wafers having different diameters, without the need to manually adjust the positions of guide pins 22.

Figure 5A:
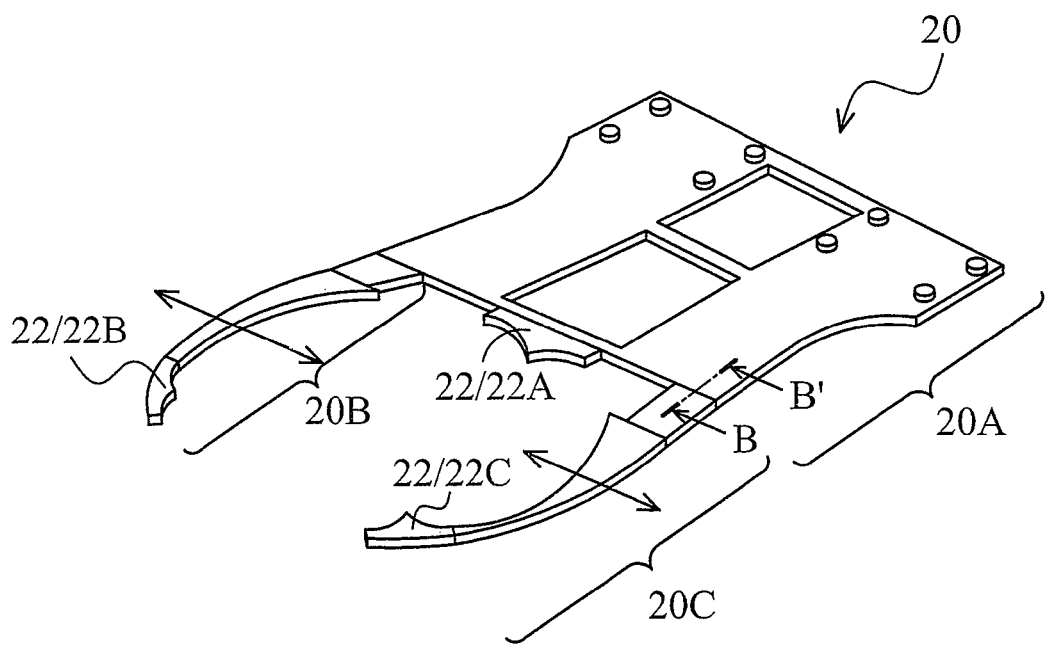
FIGS. 5A and 5B are perspective views of arm-controlled guide pins mounted on a robot arm, wherein the positions of some guide pins can be changed.
Figure 5B:
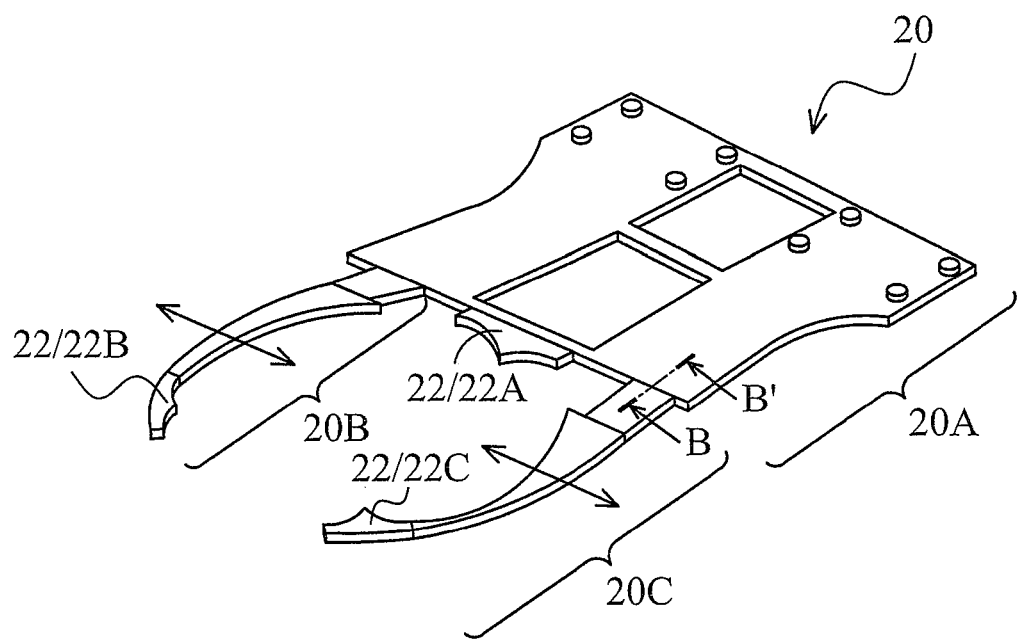
Figure 6:
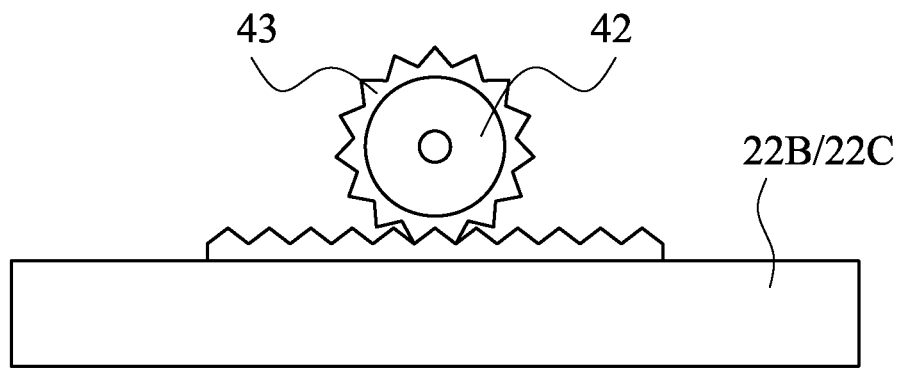
FIG. 6 illustrates a gear for driving the arm-controlled guide pins.

FIGS. 5A and 5B illustrate arm-controlled guide pins 22 in accordance with an alternative embodiment. Referring to FIG. 5A, robot arm 20 includes base 20A and movable parts 20B and 20C, which are configured to move/glide relative to base 20A. In an embodiment, base 20A includes a movement guide (not shown in FIG. 5A, please refer to guide 40 in FIG. 7) for each of movable parts 20B and 20C, so that movable parts 20B and 20C may glide in the corresponding movement guides 40. FIG. 5B illustrates a similar view as shown in FIG. 5A, except movable parts 20B and 20C in FIG. 5B have moved toward each other compared to what are shown in FIG. 5A. FIG. 6 illustrates a magnified view of a part of robot arm 20. In an exemplary embodiment, to move movable parts 20B and 20C, motor 42, which is secured on base part 20A (not shown in FIG. 6, please refer to FIGS. 5A and 5B), is configured to rotate gear 43, which comprises teeth for driving movable parts 20B or 20C to glide in the respective movement guides 40. The driving of movable parts 20B and 20C may also be achieved by using other mechanisms.

Figure 7:
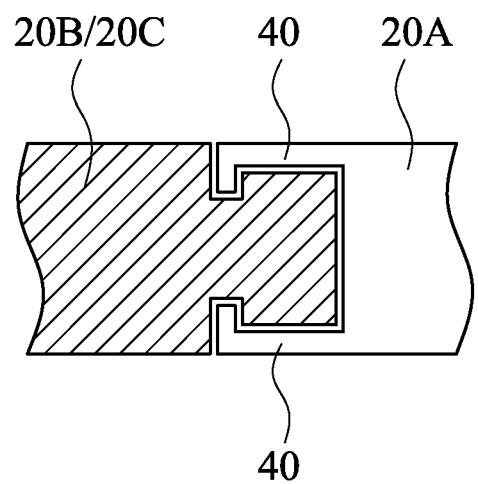
FIG. 7 illustrates a guide in a robot arm, wherein the guide allows movable arms of the robot arm to move.

FIG. 7 illustrates a cross-sectional view of base part 20A of robot arm 20, wherein the cross-sectional views shown in FIG. 7 may be obtained from the plane crossing line B-B' in FIGS. 5A and 5B. Accordingly, referring back to FIGS. 5A and 5B, it is observed that movable parts 20B and 20C can move in directions parallel to each other. When movable parts 20B and 20C move toward each other, the diameter D1 of circle 23 (refer to FIG. 2), which is defined by guide pins 22, decreases. Conversely, when movable parts 20B and 20C move away from each other, the diameter D1 of circle 23 (refer to FIG. 2) increases. Accordingly, by adjusting the positions of guide pins 22B and 22C to appropriate positions, diameter D1 of circle 23 may be adjusted to the value equal to the diameter of the wafer that is to be transferred by robot arm 20 (possibly with the minimum allowance S1). Accordingly, by using arm controllable guide pins 22, robot arm 20 may be quickly adjusted to support and center wafers having different sizes.

In accordance with embodiments, an apparatus includes a robot arm, and a plurality of guide pins mounted on the robot arm. Each of the plurality of guide pins includes a plurality of wafer supports at different levels, with each of the plurality of wafer supports configured to support and center a wafer having a size different from wafers configured to be supported and centered by remaining ones of the plurality of wafer supports.

In accordance with other embodiments, an apparatus includes a robot arm; a micro stage including a fixed part and a movable part, wherein the fixed part is secured onto the robot arm; and a plurality of guide pins. One of the plurality of guide pins is mounted on the movable part of the micro stage. The plurality of guide pins is configured to support a wafer.

In accordance with yet other embodiments, an apparatus includes an arm-controlled robot arm including a base, and a first movable part and a second movable part attached to the base, wherein the first and the second movable parts are configured to glide relative to the base. The apparatus further includes a first guide pin mounted on the base, and a second guide pin and a third guide pin mounted on the first and the second movable parts, respectively, wherein the first, the second, and the third guide pins are configured to support a wafer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
  a robot arm; and
  a plurality of guide pins mounted on the robot arm, wherein each of the plurality of guide pins comprises a plurality of wafer supports at different levels, with each of the plurality of wafer supports configured to support and center a wafer having a size different from wafers configured to be supported and centered by remaining ones of the plurality of wafer supports, wherein each of the plurality of guide pins further comprises:
    a first wafer supporting portion configured to support a first wafer, the first wafer supporting portion having a first top surface parallel to a major surface of the first wafer;
    a second wafer supporting portion configured to support a second wafer, the second wafer supporting portion having a second top surface parallel to a major surface of the second wafer and a bottom surface parallel to the second top surface, the bottom surface opposite the second top surface and facing the first top surface; and
    a slanted portion extending from the first wafer supporting portion to the second wafer supporting portion, the slanted portion being diagonal to the first top surface and the second top surface, the bottom surface of the second wafer supporting portion overhanging the slanted portion.

2. The apparatus of claim 1, wherein each of the plurality of guide pins comprises a slanted portion and parallel portions not vertical to the slanted portion, with the parallel portions attached to the slanted portion.

3. The apparatus of claim 1, wherein upper ones of the plurality of wafer supports are configured to support and center wafers having greater diameters than lower ones of the plurality of wafer supports.

4. The apparatus of claim 1, wherein the robot arm is a part of process robot arm (PRA) module.

5. The apparatus of claim 1, wherein the robot arm comprises arc arms, and wherein two of the plurality of guide pins are secured onto the arc arms of the robot arm.

6. The apparatus of claim 5 further comprising:
  a base, wherein at least one of the plurality of guide pins is mounted to the base, and wherein the arc arms are attached to the base.

7. The apparatus of claim 1, wherein each of the plurality of guide pins comprises:
  a top portion above the second wafer supporting portion, the top portion extending in a direction parallel to the top surface of the second wafer supporting portion.

8. An apparatus comprising:
  an arm-controlled robot arm comprising:
    a base; and
    a first movable part and a second movable part attached to the base, wherein the first and the second movable parts are configured to glide relative to the base, wherein the first and the second movable parts are configured to move in directions parallel to each other;
  a first guide pin mounted on the base, the first guide pin being stationary relative to the entire base; and
  a second guide pin and a third guide pin mounted on the first and the second movable parts, respectively, wherein the first, the second, and the third guide pins are configured to support a wafer.

9. The apparatus of claim 8, wherein each of the first and the second movable parts comprises an arc arm.

10. The apparatus of claim 8, wherein the first, the second, and the third guide pins define a circle having a size substantially equal to the wafer.

11. The apparatus of claim 8, wherein the robot arm is a part of process robot arm (PRA) module.

12. The apparatus of claim 8, wherein the first and second movable parts are gear driven.

13. The apparatus of claim 8, wherein the second and third guide pins are mounted to the first and second movable parts with screws.

14. An apparatus comprising:
  a robot arm comprising:
    a base;
    a first moveable arc arm attached to and supported by the base; and
    a second moveable arc arm attached to and supported by the base;
  a first guide pin directly affixed to the base, the first guide pin being stationary relative to the entire base;
  a second guide pin mounted on the first moveable arc arm; and
  a third guide pin mounted on the second moveable arc arm, the first, the second, and the third guide pins being configured to support a wafer.

15. The apparatus of claim 14, wherein the first, the second, and the third guide pins define a circle having a first diameter.

16. The apparatus of claim 15, wherein the first moveable arc arm and the second moveable arc arm are each configured to travel toward and away from a center of the circle.

17. The apparatus of claim 15, wherein the wafer has a second diameter, the second diameter being less than the first diameter by a first spacing, the first spacing being greater than zero.

18. The apparatus of claim 15, wherein the first, the second, and the third guide pins each comprise a plurality of wafer supports at different levels.

19. The apparatus of claim 18, wherein upper ones of the plurality of wafer supports are configured to support and center wafers having greater diameters than lower ones of the plurality of wafer supports.

* * * * *

UNITED STATES PATENT AND TRADEMARK OFFICE
CERTIFICATE OF CORRECTION

| | | |
|---|---|---|
| PATENT NO. | : 9,099,515 B2 | Page 1 of 1 |
| APPLICATION NO. | : 13/973740 | |
| DATED | : August 4, 2015 | |
| INVENTOR(S) | : Hsin Chang | |

It is certified that error appears in the above-identified patent and that said Letters Patent is hereby corrected as shown below:

In the claims

In Col. 6, line 8, claim 6, delete "and wherein the are arms are" and insert --and wherein the arc arms are--.

Signed and Sealed this
Twelfth Day of January, 2016

Michelle K. Lee
*Director of the United States Patent and Trademark Office*